(12) United States Patent
Burkhardt et al.

(10) Patent No.: US 7,406,003 B2
(45) Date of Patent: Jul. 29, 2008

(54) MULTIFUNCTIONAL TIMEPIECE MODULE WITH APPLICATION SPECIFIC PRINTED CIRCUIT BOARDS

(75) Inventors: Wolfgang Burkhardt, Ispringen (DE); Louis M. Galie, Newtown, CT (US); Michel G. Plancon, Besancon (FR); Helmut Zachmann, Remchingen (DE); Herbert Schwartz, Wurmberg (DE); Roland Burghausen, Niefern (DE); Gerhard Stotz, Eisingen (DE)

(73) Assignee: Timex Group B.V. (NL)

( * ) Notice: Subject to any disclaimer, the term of this patent is extended or adjusted under 35 U.S.C. 154(b) by 0 days.

(21) Appl. No.: 10/737,421

(22) Filed: Dec. 16, 2003

(65) Prior Publication Data
US 2004/0240323 A1 Dec. 2, 2004

Related U.S. Application Data

(60) Provisional application No. 60/474,180, filed on May 29, 2003.

(51) Int. Cl.
*G04F 10/00* (2006.01)
*G04B 47/06* (2006.01)
(52) U.S. Cl. ............................. 368/8; 368/14
(58) Field of Classification Search ............ 368/8, 368/88, 204, 276, 220, 228, 203, 318, 14
See application file for complete search history.

(56) References Cited

U.S. PATENT DOCUMENTS

| | | | | |
|---|---|---|---|---|
| 4,430,005 A | * | 2/1984 | Nishimura | 368/67 |
| 4,817,196 A | * | 3/1989 | MacNak et al. | 455/193.1 |
| 5,210,722 A | * | 5/1993 | Schwartz | 368/88 |
| 6,618,328 B1 | * | 9/2003 | Ellner et al. | 368/88 |

(Continued)

FOREIGN PATENT DOCUMENTS

EP 0 195 636 9/1986

(Continued)

*Primary Examiner*—Edwin A. Leon
*Assistant Examiner*—Thanh S Phan
(74) *Attorney, Agent, or Firm*—Carmody & Torrane LLP (57) ABSTRACT

An electronic device that includes functionality to perform at least two functions, a first of which may be timekeeping and the other of which is at least a function other than the first function. The electronic device comprises a multilayered module comprising a frame having a frame surface; at least two physically separable printed circuit boards, the first of which includes means related to at least the timekeeping and the second of which includes means related to at least the function other than timekeeping, wherein the first printed circuit board is intermediate the frame surface and the second printed circuit board; a battery compartment dimensioned for receiving a battery, wherein the battery compartment is asymmetrically positioned within the module thus creating a region above the first printed circuit board and proximate the battery compartment; and wherein the second printed circuit board is securable within the module and in the region; wherein the functionality of the electronic device can be changed and/or modified by a removal of the second printed circuit board and a replacement with another printed circuit board having means at least in part different from and/or in addition to the means of the second printed circuit board; whereby the first printed circuit board need not be removed to provide for such additional and/or different functionality provided by the replacement printed circuit board.

20 Claims, 7 Drawing Sheets

U.S. PATENT DOCUMENTS

2001/0014055 A1    8/2001  Martin et al.
2003/0016315 A1*   1/2003  Ueno et al. .................. 349/66
2003/0210612 A1*  11/2003  Stern .......................... 368/110
2004/0237319 A1*  12/2004  Stotz .......................... 33/356

FOREIGN PATENT DOCUMENTS

WO          84/04406        11/1984

* cited by examiner

MULTIFUNCTIONAL TIMEPIECE MODULE WITH APPLICATION SPECIFIC PRINTED CIRCUIT BOARDS

RELATED U.S. APPLICATION DATA

This application claims the benefit of U.S. Provisional Application No. 60/474,180 filed on May 29, 2003.

BACKGROUND OF THE INVENTION

The present invention is generally directed to the construction of electronic devices, such as timepieces in general and watches in particular, and specifically, to an improved module construction for such electronic devices that allows for increased functional versatility.

Manufacturers of timepieces, as well as manufactures of all electronic devices, continually seek ways to meet the needs of its consumers. One way to do so is by providing such a wide range of products that would be of interest to the consumer.

From an inventory control and a manufacturing perspective, it is always a desire and objective to design such electronic devices with the most amount of common components, thereby decreasing inventory costs while also making the manufacturing process as easy and inexpensive as possible, notwithstanding differences among the products.

In any family of products, such as timepieces in general and watches specifically, there are certain basic features and components that remain the same throughout each of the products, no matter what specific differences each product may have. For example, it would not be uncommon to find certain consistencies across a wide range of products, such as timepiece module size and dimensions, certain circuit board layouts and design, battery requirements and characteristics, dial and gear train constructions and/or LCD displays. Thereafter, with any "basic" module design, all that would need to vary between differing products are those features and components that are needed to provide such functional differences, enhancements and/or modifications.

The assignee of the present invention has recognized that consistency and uniformity, where possible, is important for a number of reasons, not the least of which are inventory control costs, manufacturing capabilities and costs, and brand recognition. The more a timepiece module can remain the same, the more optimized the manufacturing process can become. For example, timepieces with a compass mode, a heart rate monitor, an altimeter function or the like, are all believed to be possible within a common timepiece module. In fact, reference may be had to coowned and copending U.S. application Ser. No. 10/441,417, the subject matter of which is incorporated by reference as if fully set forth herein, which discloses the wide potential of differing products that are available under one common design.

Accordingly, it is desirable to design and construct a timepiece module that provides and allows for increased functional versatility.

SUMMARY AND OBJECTS OF THE INVENTION

It is therefore an object of the present invention to provide an improved electronic device that includes functionality to perform at least two functions. In a generic embodiment, the second function is different from and/or in addition to the first function. In a specific embodiment, the first function may be at least timekeeping and the other of which is at least a function other than timekeeping.

It is another object of the present invention to provide an improved electronic device that includes at least two physically separable printed circuit boards, the first of which includes means related to at least the first function (such as timekeeping by way of example and not limitation) and the second of which includes means related to at least the second function, which may or may not be a function other than timekeeping.

It is yet another object of the present invention to provide an improved electronic device in which the functionality thereof can be modified, changed and/or enhanced by the removal of the second printed circuit board and the replacement with another printed circuit board having means at least in part different from and/or in addition to the means of the second printed circuit board.

It is still another object of the present invention to provide such an electronic device where the first printed circuit board need not be removed to provide for such additional and/or different functionality provided by the replacement printed circuit board.

As stated above, it is an object of the present invention to provide an improved electronic device that includes functionality to perform at least two functions, although there need not be any requirement that the first printed circuit board include means related to the timekeeping, but rather requires only that the second circuit board include means related to a function other than what is provided by the means on the first circuit board, thereby providing modifiable, changeable and/or enhanced functional versatility by the removal of the second printed circuit board and the replacement with another printed circuit board having means at least in part different from, less than and/or in addition to the means of the second printed circuit board.

Still other objects and advantages of the invention will in part be obvious and will in part be apparent from the specification.

The invention accordingly comprises the features of construction, combination of elements and arrangement of parts and sequence of steps which will be exemplified in the construction, illustration and description hereinafter set forth, and the scope of the invention will be indicated in the claims.

To carry out the advantages and objectives set forth above and below, the present invention, generally speaking, is directed to an electronic device that includes functionality to perform at least two functions, wherein the electronic device comprises a multilayered module comprising: a frame having a frame surface; at least two physically separable printed circuit boards, the first of which includes means related to at least the first function the second of which includes means related to a function in addition to and or different from the first function, wherein the first printed circuit board is intermediate the frame surface and the second printed circuit board; a battery compartment dimensioned for receiving a battery, wherein the battery compartment is asymmetrically positioned within the module thus creating a region above the first printed circuit board and proximate the battery compartment; and wherein the second printed circuit board is securable within the module and in the region; wherein the functionality of the electronic device can be changed and/or modified by a removal of the second printed circuit board and a replacement with another printed circuit board having means at least in part different from and/or in addition to the means of the second printed circuit board; whereby the first printed circuit board need not be removed to provide for such additional and/or different functionality provided by the replacement printed circuit board.

In a specific embodiment, the first function is at least timekeeping and the other function is at least a function other than timekeeping.

In other aspects of the present invention, at least one support member is provided for at least in part supporting the second printed circuit board in the module. In a specific embodiment, a plurality of support members are provided for at least in part supporting the second printed circuit board in the module, wherein at least one of the plurality of support members extends through the second printed circuit board and is electrically coupled to a top side mounted pad thereon. At least one of the plurality of support members may be electrically coupled to a bottom side mounted pad thereon. Moreover, the position of the battery compartment in the module at least essentially maximizes the region in which the second printed circuit board is positioned.

BRIEF DESCRIPTION OF THE DRAWINGS

For a fuller understanding of the invention, reference is had to the following description taken in connection with the accompanying figures, in which.

Identical parts in the Figures are labeled with the same reference numerals, although not every part in every Figure is labeled.

DETAILED DESCRIPTION OF THE PREFERRED EMBODIMENTS

The following disclosure focuses on the aspects of the present invention, although it will become readily apparent that the Figures are more inclusive. However, since many aspects illustrated in the drawings are not material to the present invention, no specific references may be made thereto, other than in an incidental manner, although reference (or lack thereof) to a particular feature or component imparts no view as to the materiality of such feature or component to the present invention. Moreover, it is believed that many aspects of the construction of an electronic device in accordance with the present invention, apart from the actual invention itself, should be well known to those skilled in the art.

Figure 7:
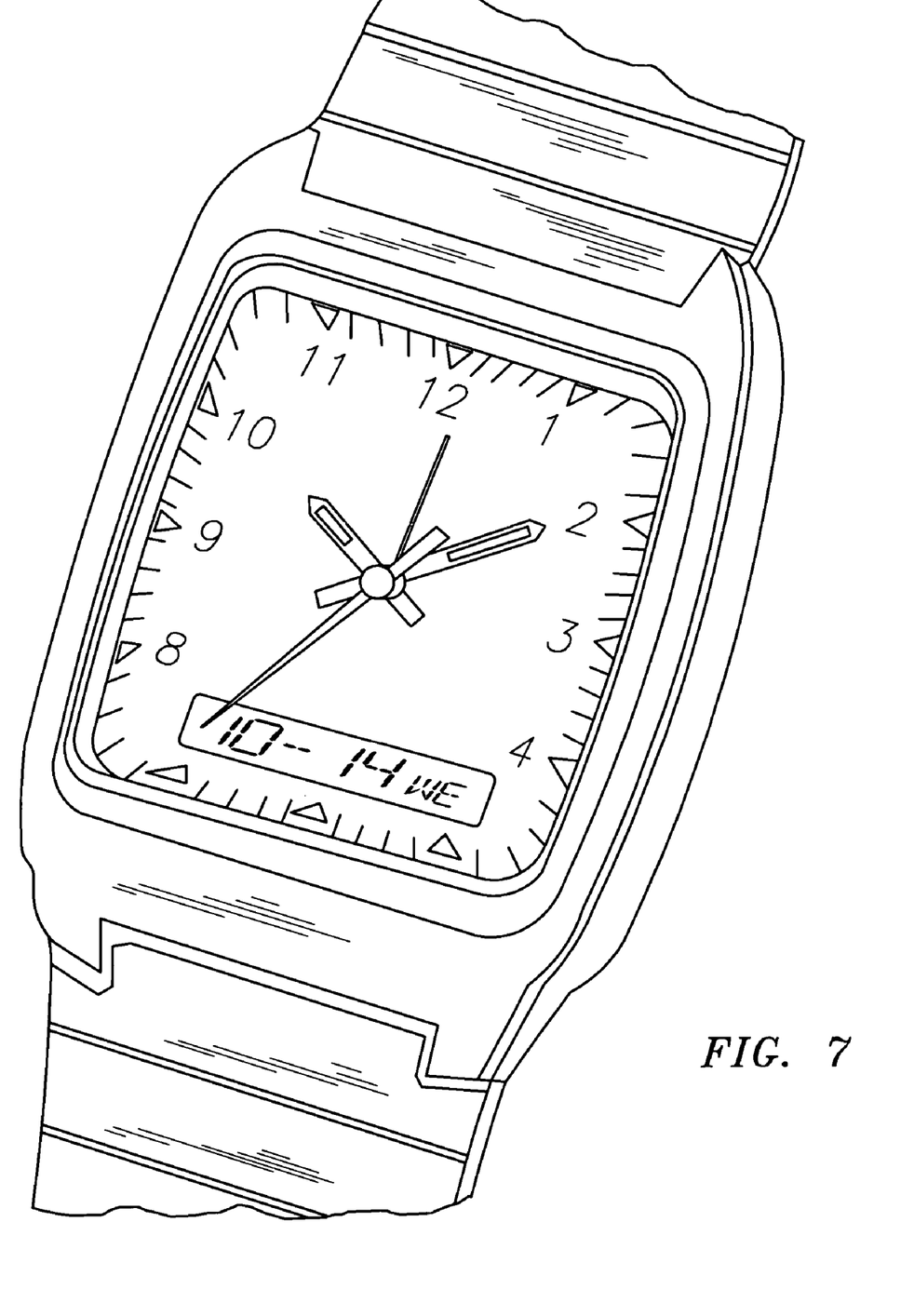
FIG. 7 illustrates an exemplary watch that incorporates the module illustrated in FIGS. 1-6, although the fact that the shape of the dial may be different should be of no concern, as clearly, a round display in the illustration of FIG. 7 should be one of design choice.

Reference is now made to FIGS. 1-7 in combination with the following disclosure for an understanding of the present invention, wherein FIGS. 1-6 illustrate various stages of completion of a module, generally indicated at 1, for use in an electronic device, such as a timepiece in general and a watch in particular. FIG. 7 illustrates a timepiece, and a watch in particular, that incorporates the module disclosed and illustrated in FIGS. 1-6.

Specifically, the Figures illustrate that module 1 is a multilayered assembly. Viewing the present invention from the dial side (i.e. FIG. 1), it can be seen that in a preferred embodiment, module 1 comprises a frame, generally indicated at 10, an EL dial assembly generally indicated at 12, which is the subject matter described in U.S. Pat. No. 4,775,964 and incorporated by reference as if fully set forth herein, and may be further dimensioned to support and accommodate an LCD assembly, generally indicated at 14. An EL lamp 16 the construction of which is well known in the art, with a driver circuit described in U.S. Pat. No. 4,527,096, is preferably provided to illuminate LCD display 14.

Although the preferred embodiment comprises both analog and digital display abilities, the present invention is not limited thereby. As should become clear below, the present invention may comprise only one or more digital displays or only one or more analog displays, and the claims should not be limited thereby.

In keeping with the objects and advantages set forth above, it is desirable to provide an electronic device of the type exemplary illustrated in the figures that can be made functionally versatile with minimum modifications to the module. For example, it is an object of the present invention to be able to incorporate such circuitry and functionality to module 1 to provide a compass mode, where directional headings can be displayed, such as on the LCD display. However, a compass mode is but one example, as other examples are heart rate information and altitude. On this last point, reference may be had to the aforementioned application Ser. No. 10/441,417 for a description of other displayable parameters.

That is, the prior art is full of examples of wristworn electrical devices that are multifunctional or uni-functional, and thus the ability to electrically design and manufacture an electronic device with one or more functions, such as sensors or receivers for measuring and or receiving parameter information, such as that disclosed and claimed in the copending '417 application is within the purview of one skilled in the art. The present invention is directed to the layout, arrangement and construction of a module that achieves the foregoing objectives.

Figure 1:
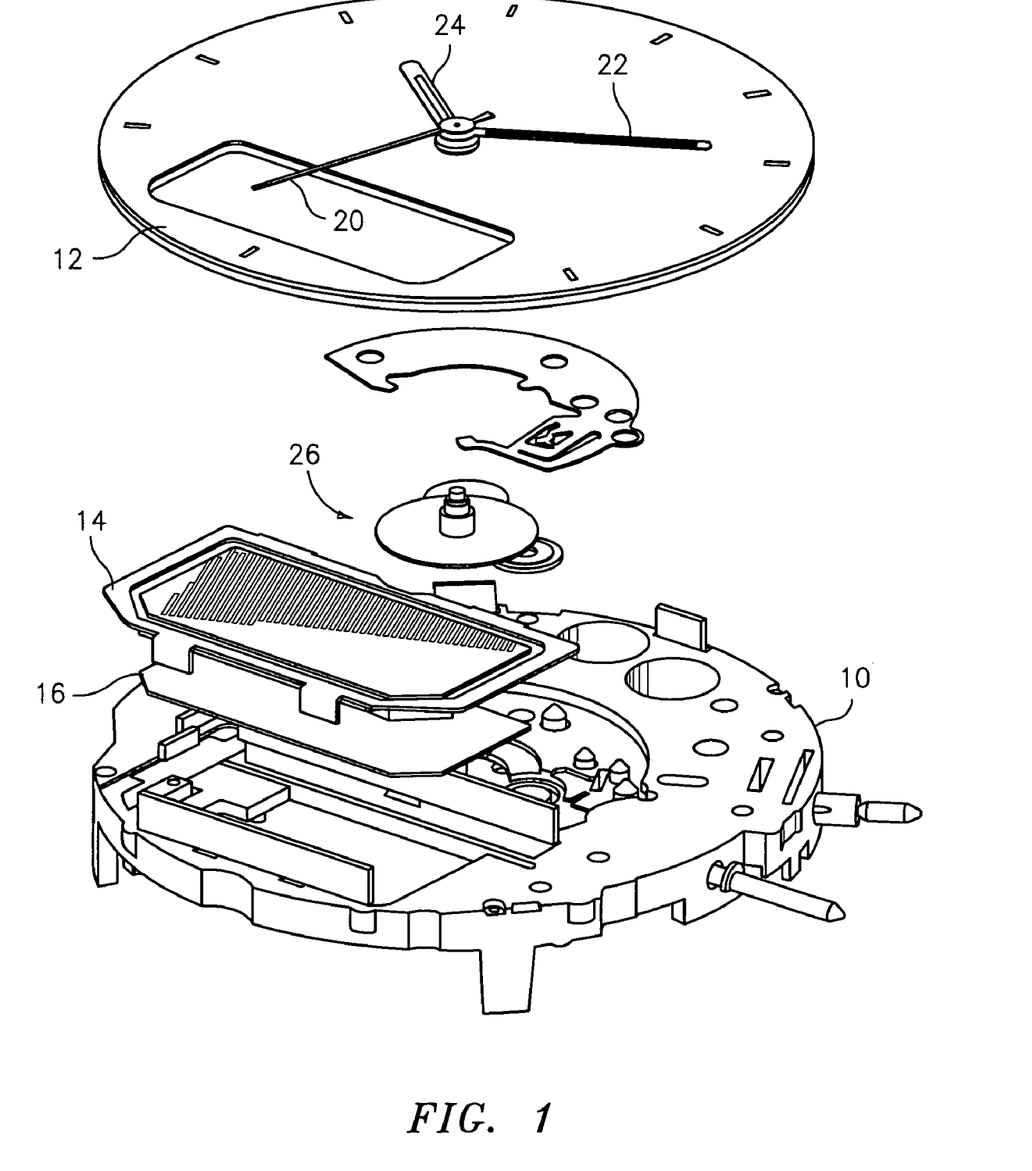
FIG. 1 is an exploded view, from the dial side, of a module for an electronic device and a timepiece in particular, constructed in accordance with the present invention.
Figure 2:
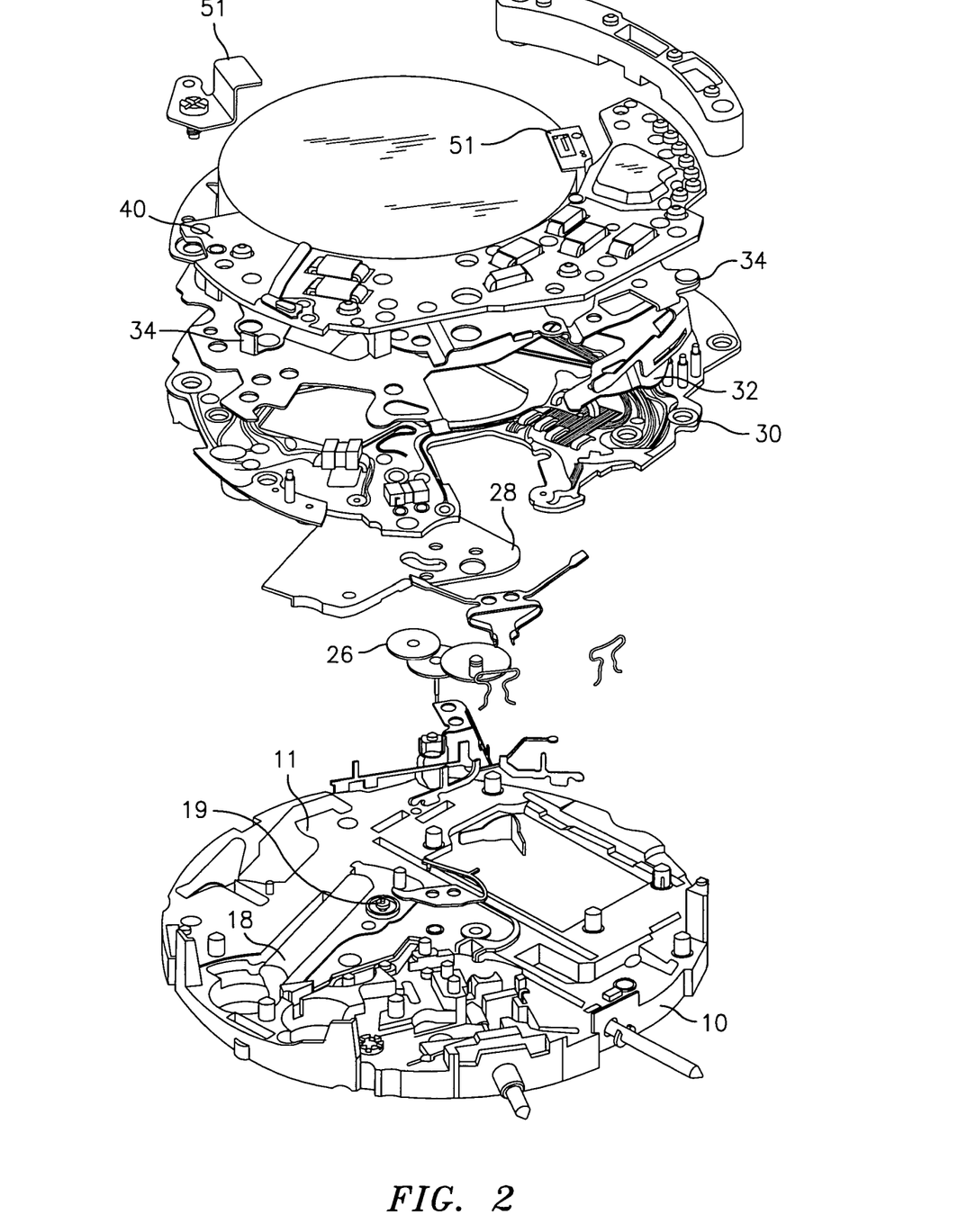
FIG. 2 is an exploded view, from the movement side, of the module illustrated in FIG. 1.

Accordingly, and in keeping with the objects and advantages set forth above, reference is now made to FIG. 2 which illustrates module 1 from the movement side.

Pertinent to the present invention, it can first be seen that disposed within frame 10 is a stepper motor, generally indicated at 18 for driving one or more hands, such as second hand 20, minute hand 22 and hour hand 24. Coupled to stepper motor 18 for driving such hands is a set of gears, generally indicated at 26. As would be well understood, gears 26 are mechanically coupled to a rotor 19 of motor 18.

A bridge 28 is next layered upon frame 10. Overlying bridge 28 is a first printed circuit board assembly, generally indicated at 30. Preferably, printed circuit board assembly 30 has mounted thereon and incorporated therein all the circuitry and components for generally operating one or more functions, such as for example but not limitation, timekeeping functionality, and preferably all other functionality common to all the products that may utilize the present invention, such as backlighting or the like. An insulating layer 32 and other metal and/or plastic components, such as spring assemblies, generally and collectively indicated at 34, for interfacing with one or more side pushers, as indicated below.

The novelty of the present invention lies in the recognition and implementation of a second, application specific printed circuit board, generally indicated at 40. For example, this second circuit board may include means for taking compass and/or altitude readings, may be separately designed to interface with a transmitter external to the device to receive heart rate information, or may be include circuitry for receiving and processing speed/distance information. To accommodate this printed circuit board 40, it is preferable that the location of the battery compartment for housing battery 50 is moved towards the edge of module 1, similar to that which is described in coowned U.S. Pat. No. 5,210,722. The battery compartment may comprise clamps and/or clips 51, or may comprise a separate plastic and/or metal housing into which is positioned battery 50.

By the foregoing arrangement, second printed circuit board 40 can now preferably be disposed next to and/or in the region created by the off-centered and/or at least essentially edge mounted battery. It can be seen that the region in which the second printed circuit board 40 is positioned is essentially maximized by the edge positioning of the battery compartment (and hence the battery) in module 1. Providing a large area for second printed circuit board 40 allows for maximizing the potential functionality that may be provided by second printed circuit board 40.

In the preferred embodiment, printed circuit board 30 and printed circuit board 40 are physically separable printed circuit boards. In one embodiment, if circuit board 30 includes means related to at least timekeeping, printed circuit board 40 preferably includes means related to at least a function other than timekeeping. However as indicated below, the invention should be understood to be broader. The figures also make clear that printed circuit board 30 is intermediate frame surface 11 and printed circuit board 40.

Figure 3:
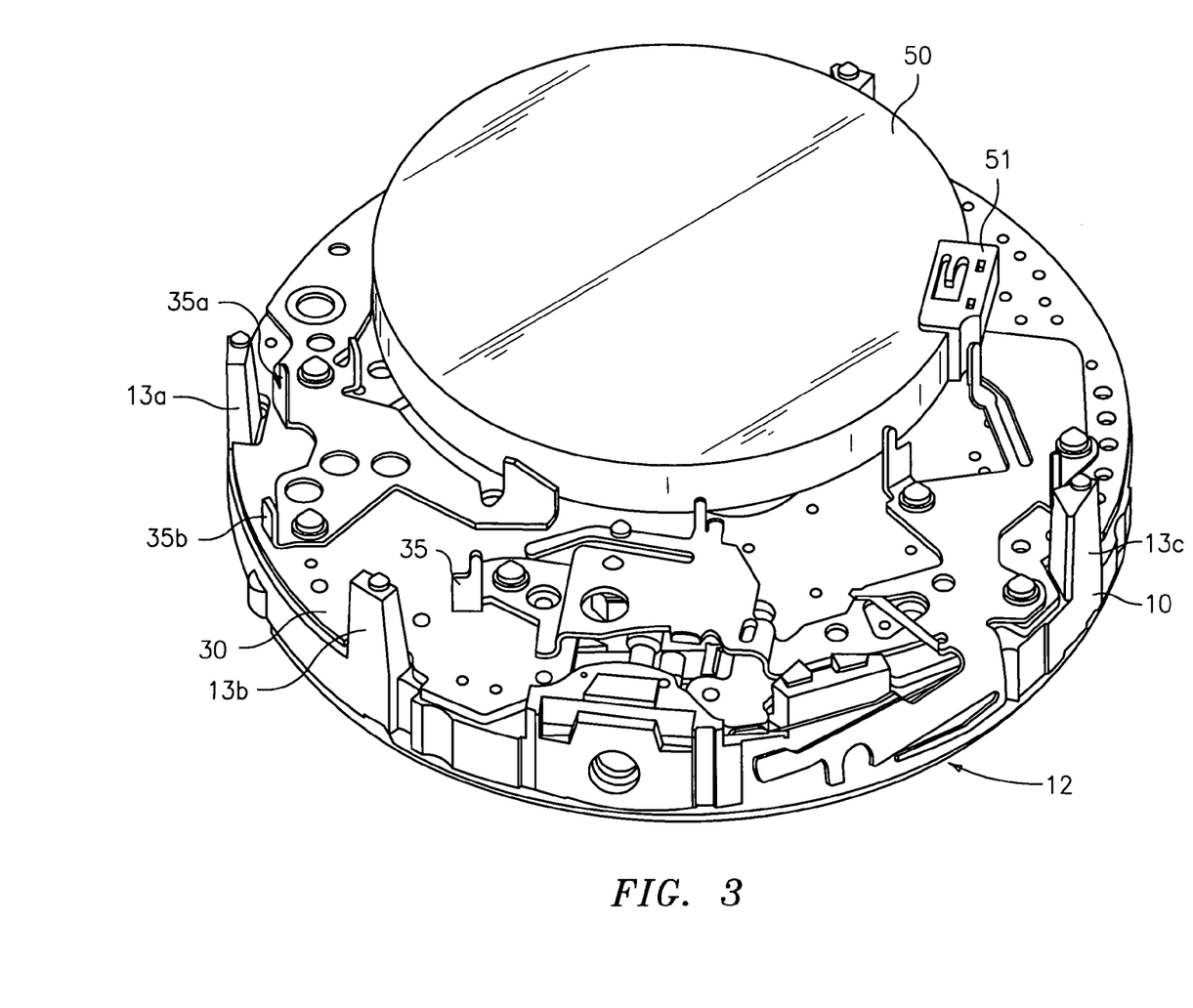
FIG. 3 is a perspective view of the module of FIG. 2 at an intermediate stage of contraction.
Figure 4:
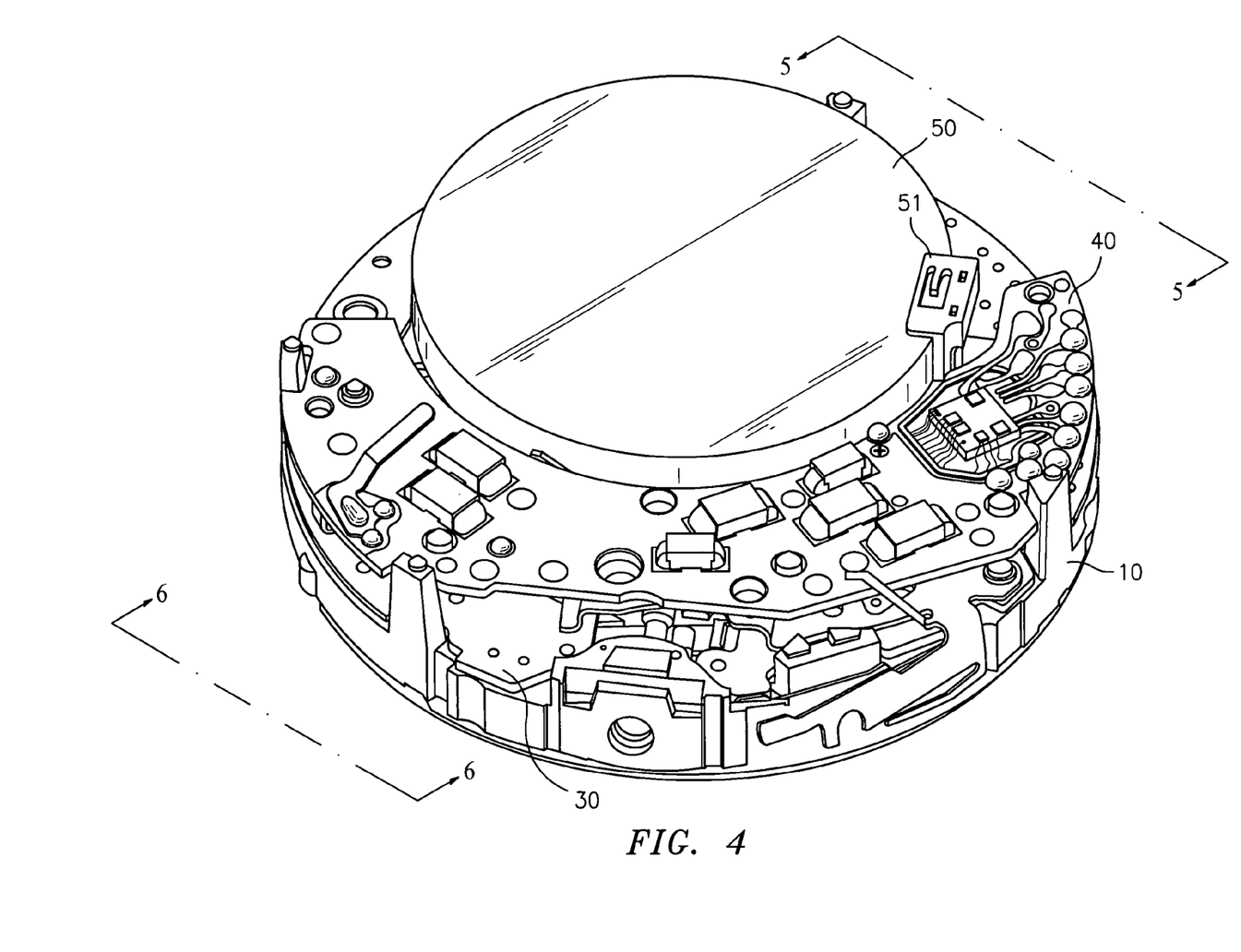
FIG. 4 is a perspective view of the module of FIG. 2 at a more advanced stage of contraction.
Figure 5:
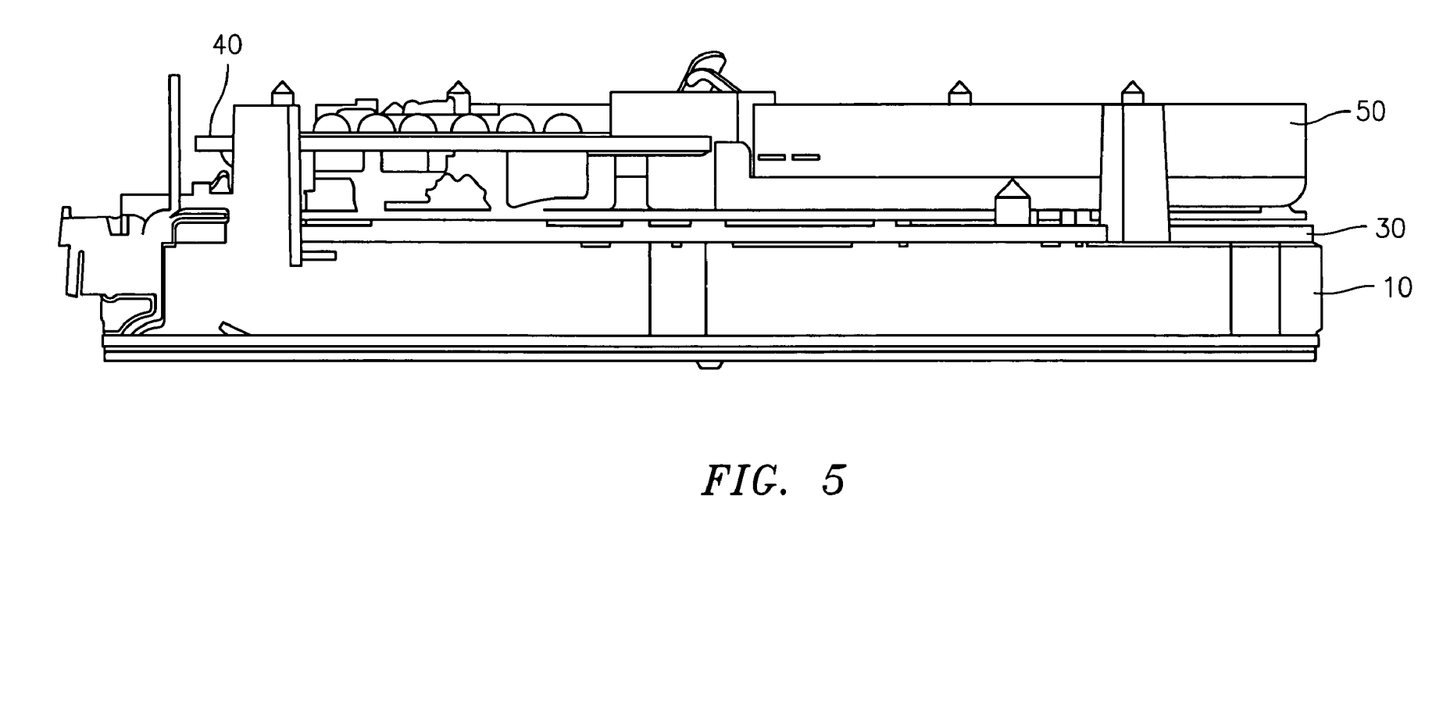
FIG. 5 is a view of the module of FIG. 2 taken about the lines 5-5 of FIG. 4.
Figure 6:
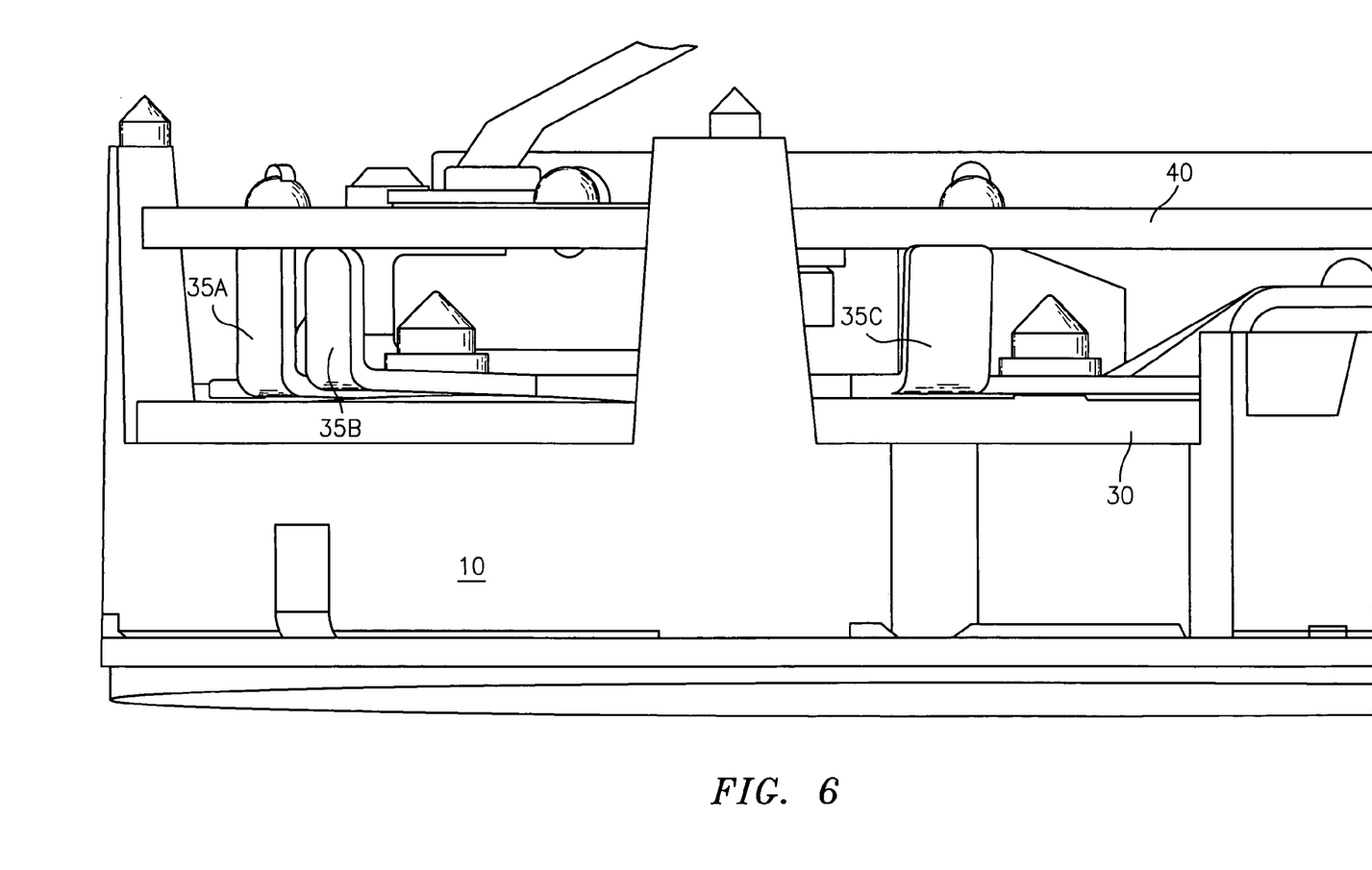
FIG. 6 is a view of the module of FIG. 2 taken about the lines 6-6 of FIG. 4.

As is also clear from FIGS. 3 and 4, the battery compartment that receives the battery is asymmetrically positionable within the module, thus creating a region above printed circuit board 30 and proximate the battery compartment and/or the battery.

Printed circuit board 40 is securable within module 1 and preferably positioned in the region proximate the battery compartment and/or the battery. In this way, the functionality of the electronic device can be modified by a removal of second printed circuit board 40 and replaced with another printed circuit board (not shown) having means at least in part different from and/or in addition to the means of second printed circuit board 40. In this way, a single electronic device can be upgraded, downgraded and/or functionally changed by the removal and replacement of the second printed circuit board. Moreover, it can be seen that with the foregoing construction, printed circuit board 30 need not be removed to provide for such additional and/or different functionality provided by the replacement printed circuit board.

Another aspect of the present invention is the novel support arrangement for second printed circuit board 40. In the preferred embodiment, module 1 comprises at least one support member integrally formed with conductive member 34, for at least in part supporting second printed circuit board 40 in the module. More preferably, the module comprises a plurality of support members formed on conductive member 34, for at least in part supporting the second printed circuit board in the module. As stated above, conductive member 34 is shown to have interfacing means, such as spring action, for interfacing with side/top and/or front mounted pushers (not shown). These pushers allow a user to select and operate the electronic device, as would be well known in the art and the use the conductive member 34 to support circuit board 40 reduces the number of parts needed to carry out the present invention.

Generally speaking, the support members are all designated generally by reference number 35, and are specifically labeled with corresponding letters to assist in understanding the figures. For example, it can be seen that support member 35c extends through printed circuit board 40 and is electrically coupled to a top side mounted pad thereon. Others of the plurality of support members, such as support members 35a and 35b, may be respectively electrically coupled to one or more bottom side mounted pads thereon.

Posts 13a, 13b, 13c also assist in positioning and aligning at least second printed circuit board 40 in module 1, and may also provide a desirable amount of friction-fitting. However, circuit board 40 may be primarily secured within module, and to support members 35, by soldering.

Interfacing the various components and circuitry disclosed herein would be within the purview of one skilled in the art, and therefore, omitted herein for purposes of brevity, since the prior art is filled with examples of electronic devices, such as timepieces in general and watches in particular, that provide for one or more features separate and apart from, yet in addition to, telling time. Accordingly, it is believed that the manner in which for example, printed circuit board 40 is electrically connected to and interfaces with the circuitry on PC board 30 is well known to those skilled in the art.

It can thus be seen that the present invention provides an improved electronic device that includes functionality to perform at least two functions, a first of which may be, but is not required to be, timekeeping and the other of which is at least a function other than timekeeping (or that which is the first function). That is, the foregoing is only by example, since the present invention is more broadly directed to an improved electronic device that includes functionality to perform at least two functions, and there need not be any requirement that the first printed circuit board include means related to the timekeeping, but rather requires only that the second circuit board include means related to a function other than what is provided by the means on the first circuit board. In either embodiment, the present invention provides for the modification, changeability and/or enhancement of the functions that can be performed by the electronic device, all of which is achieved by the ability to remove the second printed circuit board and replace it with another printed circuit board having means at least in part different from, less than and/or in addition to the means of the second printed circuit board, all of which is achieved without needing to remove the first printed circuit board.

It will thus be seen that the objects set forth above, among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

Finally, it should be well appreciated that the present invention is well suited for a wide variety of electronic devices. Therefore, while the present disclosure provides its preferred embodiment as being a timepiece in general and a watch in particular, the invention should not be deemed to be so limited. That is, it should be clear that any electronic device that could utilize the present invention is intended to be covered hereby.

What is claimed is:

1. An electronic device that includes functionality to perform at least two functions, a first of which is at least timekeeping and the other of which is displaying information related to a measured external parameter of a sensed condition, wherein the electronic device comprises:
a multilayered module comprising:
a frame having a frame surface;
a first printed circuit board which includes first means for timekeeping,
wherein the first printed circuit board is intermediate the frame surface and a second printed circuit board;
a battery compartment dimensioned for receiving a battery, wherein the battery compartment is asymmetrically positioned within the module thus creating a region above the first printed circuit board and proximate the battery compartment;
a removable second printed circuit board physically separable from the first printed circuit board and including second means for receiving information of the measured external parameter wherein the second printed circuit board is securable within the module and positionable in the region; and
a display, electrically coupled to the second means, for displaying information related to the measured external parameter;
wherein when the second printed circuit board is removed and replaced with another printed circuit board having third means for receiving information of a measured external parameter that is at least in part different from and/or in addition to the means of the second printed circuit board, the functionality of the electronic device is changed and/or modified and the display then becomes electrically coupled to the third means and displays information related to the external parameter measured by the third means.

2. The electronic device as claimed in claim 1, including at least one support member for at least in part supporting the second printed circuit board in the module.

3. The electronic device as claimed in claim 2, including a plurality of support members for at least in part supporting the second printed circuit board in the module, wherein at least one of the plurality of support members extends through the second printed circuit board and is electrically coupled to a top side mounted pad thereon.

4. The electronic device as claimed in claim 3, wherein at least one of the plurality of support members is electrically coupled to a bottom side mounted pad thereon.

5. The device according to claim 4, wherein at least one of the plurality of support members is integrally formed with a conductive member.

6. The device according to claim 5, wherein the conductive member comprises interfacing means for interfacing with a pusher, whereby a user can operate the device to measure and display information related to the function associated with the second means and once the second printed circuit board is removed and replaced with another printed circuit board having third means, can operate the device to measure and display information related to the function associated with the third means.

7. The electronic device as claimed in claim 1, wherein the position of the battery compartment in the module at least essentially maximizes the region in which the second printed circuit board is positioned.

8. The electronic device as claimed in claim 1, wherein the second printed circuit board is removed and replaced without removing the first printed circuit board.

9. The electronic device as claimed in claim 1, wherein the sensed condition is selected from the group consisting of direction, altitude, heart rate, speed, distance, and combinations of the foregoing.

10. The electronic device as claimed in claim 1, wherein the external parameter measured by the second means is heartrate.

11. The electronic device as claimed in claim 1, wherein the external parameter measured by the third means is heartrate.

12. The electronic device as claimed in claim 1, wherein the external parameter measured by the second means is altitude.

13. The electronic device as claimed in claim 1, wherein the external parameter measured by the third means is altitude.

14. The electronic device as claimed in claim 1, wherein the external parameter measured by the second means is earth's magnetic field.

15. The electronic device as claimed in claim 1, wherein the external parameter measured by the third means is earth's magnetic field.

16. The electronic device according to claim 1, wherein the display is coupled to the frame of the multi-layer module, whereby the second printed circuit board is removed and replaced with another printed circuit board without removing the display.

17. An electronic device that includes functionality to perform at least a first function and a second function, wherein the at least the second function relates to receiving and displaying information related to an external parameter, wherein the electronic device comprises:
a multilayered module comprising:
a frame having a frame surface;
a first printed circuit board which includes first means relating to at least the first function, wherein the first printed circuit board is intermediate the frame surface and a second printed circuit board;
a battery compartment dimensioned for receiving a battery, wherein the battery compartment is asymmetrically positioned within the module thus creating a region above the first printed circuit board and proximate the battery compartment;
a removable second printed circuit board physically separable from the first printed circuit board including second means related to at least the second function in additional to or different from the first function wherein the second printed circuit board is securable within the module and positionable in the region; and
a display, electrically coupled to the first and second means, for displaying information related to the function associated with the first and the second means;
wherein when the second printed circuit board is removed and replaced with another printed circuit board having third means related to a third function for receiving and displaying information related to an external parameter that is at least in part different from the external parameter of the second function, the functionality of the electronic device is changed and/or modified and the display then becomes electrically coupled to the third means and displays information related to the function associated with the first means and the third means.

18. The electronic device as claimed in claim 17, wherein the second printed circuit board is removed and replaced without removing the first printed circuit board.

19. The electronic device as claimed in claim 17, wherein the sensed condition is selected from the group consisting of direction, altitude, heart rate, speed, distance, and combinations of the foregoing.

20. An electronic device that includes functionality to perform at least two functions, a first of which is at least timekeeping and the other of which is displaying information related to a measured external parameter of a sensed condition, wherein the electronic device comprises:

a multilayered module comprising:
  a frame having a frame surface;
  a first printed circuit board which includes first means for timekeeping, wherein the first printed circuit board is intermediate the frame surface and a second printed circuit board;
  a battery compartment dimensioned for receiving a battery, wherein the battery compartment is asymmetrically positioned within the module thus creating a region above the first printed circuit board and proximate the battery compartment;
  a removable second printed circuit board physically separable from the first printed circuit board and including second means for measuring the external parameter, wherein the second printed circuit board is securable within the module and positionable in the region; and
  a display, electrically coupled to the second means, for displaying information related to the measured external parameter;
wherein
  when the second printed circuit board is removed and replaced with another printed circuit board having third means for measuring an external parameter that is at least in part different from and/or in addition to the means of the second printed circuit board, the functionality of the electronic device is changed and/or modified and the display then becomes electrically coupled to the third means and displays information related to the external parameter measured by the third means.

* * * * *